United States Patent [19]

Siniscalchi et al.

[11] Patent Number: 5,650,950
[45] Date of Patent: Jul. 22, 1997

[54] APPARATUS AND METHOD FOR ACCURATELY ESTABLISHING A CUT-OFF FREQUENCY IN AN ELECTRONIC FILTER

[75] Inventors: Patrick P. Siniscalchi, Sachse; William R. Krenik, Garland; Michael D. Aragon, Sachse, all of Tex.

[73] Assignee: Texas Instruments Incorporated, Dallas, Tex.

[21] Appl. No.: 455,867

[22] Filed: May 31, 1995

[51] Int. Cl.$^6$ ...................................................... G06J 1/00
[52] U.S. Cl. ............................................................ 364/607
[58] Field of Search .................................. 364/602, 607, 364/825

[56] References Cited

U.S. PATENT DOCUMENTS 5,461,583 10/1995 Fensch et al. ......................... 364/607

Primary Examiner—Tan V. Mai
Attorney, Agent, or Firm—W. Daniel Swayze, Jr.; Richard L. Donaldson; W. James Brady, III

[57] ABSTRACT

A programmable, electronic filter (10) includes a memory device such as a Read Only Memory ROM (22) for storing specific cut-off frequency adjustment data corresponding to various cut-off frequencies. The ROM (22) receives a ROM address (28) corresponding to a cut-off frequency signal (26). The ROM (22) generates a specific cut-off frequency adjustment value (30) for a digital-to-analog convertor (20) to produce an output reference current (34). A reference voltage (40), an error amplifier (14), a master transconductance element (16), and a capacitor (18) serve as a tuning loop and ultimately produce a control signal (38) in response to the output reference current (34). Control signal (38) serves as an input to slave filter (12) along with the cut-off frequency signal (26). The slave filter (12) may then serve as an electronic filter having the desired frequency-response characteristic. The slave filter (12) may then receive a slave filter input signal (44) and provide a filtered output signal (46) having an accurate frequency-response characteristic at the desired cut-off frequency.

20 Claims, 1 Drawing Sheet

5,650,950

APPARATUS AND METHOD FOR ACCURATELY ESTABLISHING A CUT-OFF FREQUENCY IN AN ELECTRONIC FILTER

TECHNICAL FIELD OF THE INVENTION

The present invention relates in general to the field of electronics, and more particularly to an apparatus and method for accurately establishing a cut-off frequency in an electronic filter.

BACKGROUND OF THE INVENTION

Electronic filters may receive an input signal having various frequency components and transmit a corresponding output signal having some or all of the input signal's frequency components. Depending on the type of electronic filter, frequencies within certain designated frequency ranges may be passed while other frequencies are attenuated. Pass band refers to the range of frequencies which may be transmitted and attenuation band refers to the range of frequencies that will be suppressed. Filters may be classified according to the ranges of their pass band and attenuation band. Filters may be generally classified as low-pass, high-pass, band-pass, and band-stop. A low-pass filter passes relatively low frequencies, and a high-pass filter passes relatively high frequencies. A band-pass filter passes the frequencies of a signal within a particular frequency range while attenuating the frequencies of the signal outside of this frequency range. A band-stop filter passes all frequencies of a signal except those frequencies within a particular frequency range.

Applications using electronic filters, such as programmable, electronic filters, often require accurate cut-off frequencies. Cut-off frequencies, when referring to electronic filters, refer to those frequencies that separate the pass band and the attenuation band of the frequency response characteristic of a filter. The desired cut-off frequency may be provided or input into a programmable, electronic filter so the desired filtering effects may be achieved. It is often difficult to accurately establish the desired cut-off frequencies in programmable, electronic filters. Programmable, continuous-time electronic filters often present substantial cut-off frequency difficulties. The difficulties typically arise due to such things as parasitics, capacitor or transistor mismatches, device size differences, and the resolution of programming steps.

The capacitance of capacitors used in programmable, electronic filters may vary as much as plus or minus 20%. This presents problems in accurately establishing cut-off frequencies over a given frequency range. In the tuning loop portion of a programmable, electronic filter, tuning control adjustment may be added to adjust for the variation in capacitance to ensure that one, predefined cut-off frequency may be accurately established. However, the tuning control adjustment provides an accurate cut-off frequency for this one predefined cut-off frequency to which it was originally adjusted and may not necessarily provide an accurate cut-off frequency for other desired cut-off frequency values. Therefore, these types of programmable, electronic filters do not work well in applications requiring a range of accurate cut-off frequencies. Establishing accurate cut-off frequencies becomes especially difficult when small cut-off frequency changes are required or when non-standard cut-off frequencies are desired. These difficulties may also arise due to resolution or granularity problems.

SUMMARY OF THE INVENTION

From the foregoing it may be appreciated that a need has arisen for a programmable, electronic filter with the ability to accurately establish a cut-off frequency over a range of desired cut-off frequencies.

According to an embodiment of the present invention, a cut-off frequency correction circuit, for accurately establishing a cut-off frequency, includes a memory device capable of storing and transmitting cut-off frequency adjustment data. A cut-off frequency tuning circuit, with a digital-to-analog converter, receives the cut-off frequency adjustment data from the memory device. The digital-to-analog converter generates a reference current in response.

According to another embodiment of the present invention, a method for producing a corresponding reference current for use in accurately establishing a cut-off frequency in a programmable, electronic filter is provided. The method includes receiving an initial cut-off frequency tuning signal and specific cut-off frequency adjustment data that corresponds to the desired cut-off frequency. A corresponding reference current is generated in response to the initial cut-off frequency tuning signal and the specific cut-off frequency adjustment data.

The present invention provides various technical advantages over previous programmable, electronic filters. One of the technical advantages of the present invention includes increased accuracy of cut-off frequencies in programmable, electronic filters. Another technical advantage includes the ability to accurately provide a cut-off frequency within a small frequency range or within a small frequency increment. Yet another technical advantage may include implementing the current invention in an integrated circuit where the cut-off frequency adjustment data may be stored in read-only memory ("ROM") which requires very little silicon area. Other technical advantages include the ability to make both positive and negative corrections to the cut-off frequency. A further technical advantage includes the ability to provide or modify cut-off frequency adjustment data through program control. Other technical advantages are readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figures 1, 2:
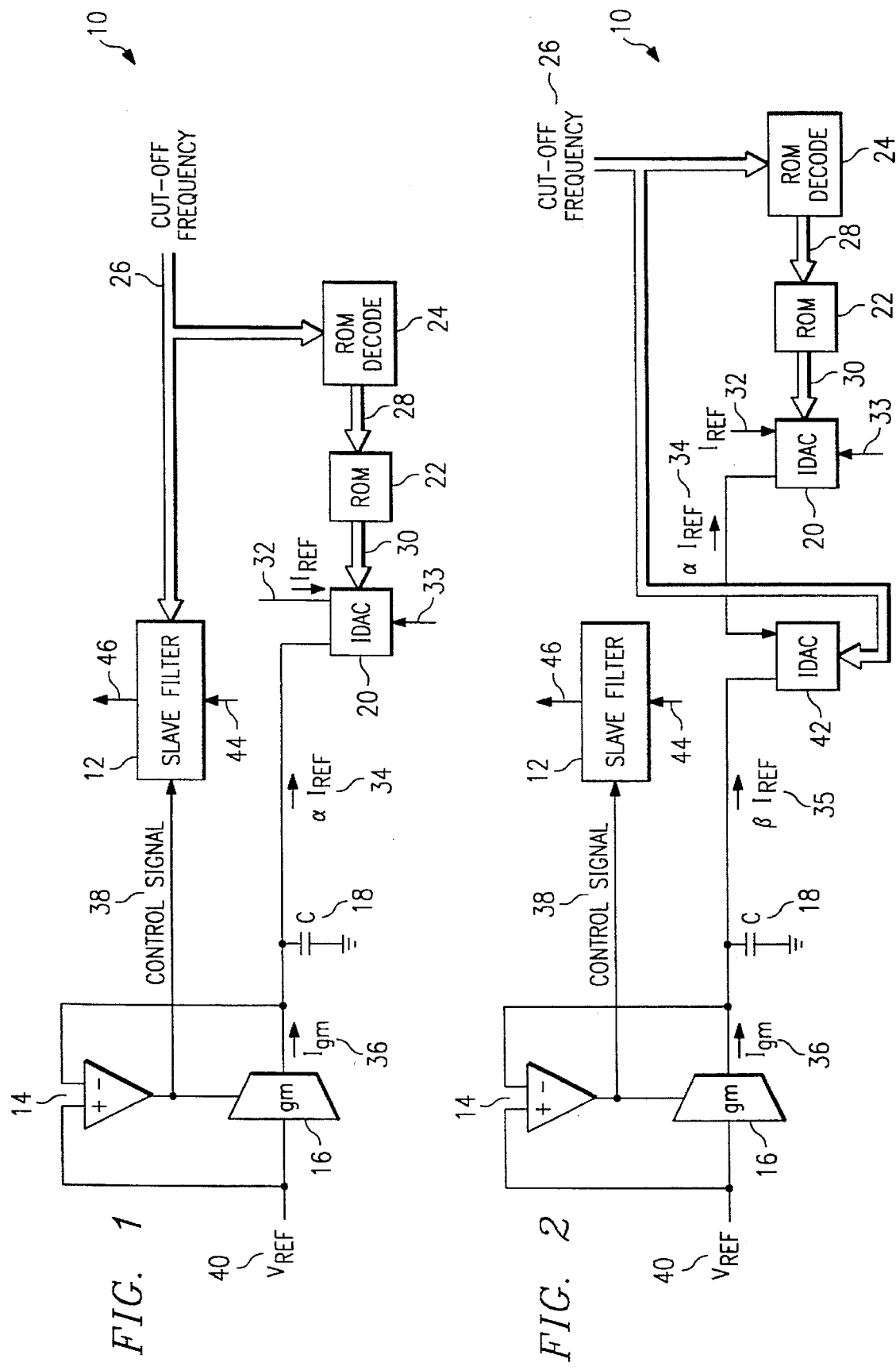
FIG. 1 is a simplified schematic representation of a programmable, electronic filter having a cut-off frequency correction circuit.
FIG. 2 is a simplified schematic representation of an alternative embodiment of the programmable, electronic filter having a cut-off frequency correction circuit.

FIG. 1 depicts a simplified schematic representation of a programmable, electronic filter 10 having a cut-off frequency correction circuit. Programmable, electronic filter 10 includes a slave filter 12, an error amplifier 14, a master transconductance element 16, a capacitor 18, a current digital-to-analog converter ("IDAC") 20, a read-only memory ("ROM") 22, and a ROM decode 24.

Various signals and values as shown in FIG. 1 are described as follows. Slave filter 12 and ROM decode 24 receive a cut-off frequency signal 26 which corresponds to the desired cut-off frequency for programmable, electronic filter 10. ROM decode 24 receives cut-off frequency signal 26 and provides a ROM address 28 in response. ROM address 28 provides the memory address of ROM 22 corresponding to a specific cut-off frequency adjustment value 30. ROM 22 provides specific cut-off frequency adjustment data 30 for a plurality of desired cut-off frequency values. IDAC 20 receives specific cut-off frequency adjustment value 30 from ROM 22 and receives an Iref input reference current 32. Input reference current 32 may be provided as a direct current ("dc") reference current. IDAC 20 also receives an initial cut-off frequency tuning signal 33, which may be provided in digital format.

IDAC 20 ultimately produces an αIref output reference current 34 that is in proportion to input reference current 32 based on specific cut-off frequency adjustment value 30 and initial cut-off tuning frequency signal 33. Output reference current 34 remains proportional to input reference current 32 according to a constant value represented by the greek letter alpha as shown in FIG. 1. Initial cut-off frequency tuning signal 33 may remain constant and is independent of cut-off frequency signal 26 and, accordingly, specific cut-off frequency adjustment value 30. Initial cut-off frequency tuning signal 33 may be established independent of the present invention and may be designed to provide compensation for capacitor variances contained in slave filter 12 at a predefined one of a plurality of cut-off frequencies. As the desired cut-off frequency is changed from the predefined cut-off frequency, in which initial cut-off frequency tuning signal 33 was established, additional inaccuracies are introduced into the filter which affect the cut-off frequency. To correct for these additional inaccuracies, a specific cut-off frequency adjustment value 30 is provided for each of the plurality of cut-off frequencies to ultimately provide additional adjustment or correction to slave filter 12. This ensures that accurate cut-off frequencies may be realized over a range of cut-off frequencies.

Error amplifier 14, master transconductance element 16, transconductance current 36, and capacitor 18 may be classified as a tuning loop. The tuning loop tunes or locks transconductance current 36 generated by master transconductance element 16 to output reference current 34. This may be accomplished by error amplifier 14 sensing a difference between reference voltage 40 and the voltage at the output of master transconductance element 16. Error amplifier 14 provides an error signal to master transconductance element 16 so that the transconductance of master transconductance element 16 may be continually adjusted to ensure that transconductance current 36 tunes or locks to output reference current 34. Capacitor 18 provides stability to the tuning loop.

The output of error amplifier 14 provides control signal 38, which also serves as the error signal or input to master transconductance element 16. Control signal 38 provides information or data to slave filter 12 to ensure that the proper steps or actions are taken within slave filter 12 so that the desired cut-off frequency may be achieved. Slave filter 12 also receives cut-off frequency 26 as input.

In operation, a digital value corresponding to the desired cut-off frequency is provided to slave filter 12 and ROM decode 24 over cut-off frequency signal 26. ROM decode 24 receives the desired cut-off frequency value and provides corresponding ROM address 28 to ROM 22. ROM 22 contains specific cut-off frequency adjustment data for a plurality of different cut-off frequencies. The specific cut-off frequency adjustment data may be preprogrammed into ROM 22 or programmed at a later time if changes are necessary or desired. The cut-off frequency adjustment data is provided as a digital word and may be established for each cut-off frequency through electronic circuit simulations or through experimentation.

The specific cut-off frequency adjustment value 30 is then provided from ROM 22 to IDAC 20. Specific cut-off frequency adjustment values, provided for a plurality of cut-off frequencies, are utilized to provide additional adjustments to slave filter 12 so that cut-off frequencies may be accurately established. The inaccuracies in programming programmable electronic filter 10 may result from parasitic capacitances, device size differences, matching of non-unit capacitors or transistors, and resolution of programming steps. These inaccuracies may vary with different frequencies, and hence, a constant cut-off frequency adjustment value for each cut-off frequency will not provide the needed cut-off frequency accuracy. Therefore, specific cut-off frequency adjustment values are provided for each desired cut-off frequency. Each adjustment value may be established by performing circuit simulation or through experimentation.

The specific cut-off frequency adjustment value 30 may be provided in a digital word format and allow for both positive and negative corrections to the cut-off frequency. For example, if specific cut-off frequency adjustment value 30 is provided as a four bit word, the four bit word corresponding to no adjustment to the cut-off frequency may be 1000. Specific cut-off frequency adjustment value 30 may then be programmed down to 0000 for negative cut-off frequency correction and up to 1111 for positive cut-off frequency correction for the desired cut-off frequency.

IDAC 20 produces output reference current 34 in response to receiving specific cut-off frequency adjustment value 30 and initial cut-off frequency tuning signal 33. IDAC 20 converts quantities specified as binary inputs to an output current proportional to the value of the digital inputs. As mentioned previously, initial cut-off frequency tuning signal 33 remains the same for the various specific cut-off frequency adjustment values 30 and is established independently for one predefined cut-off frequency. IDAC 20 generates output reference current 34 in proportion to input reference current 32. The relationship between output reference current 34 and input reference current 32 depends upon the values of initial cut-off frequency tuning signal 33 and specific cut-off frequency adjustment value 30.

Output reference current 34 then serves as a reference current for a tuning loop defined by reference voltage 40, error amplifier 14, master transconductance element 16, transconductance current 36, and capacitor 18. The tuning loop continuously ensures that transconductance current 36 tunes or locks to output reference current 34 provided by IDAC 20.

Error amplifier 14 continually monitors the voltage difference between reference voltage 40 and the voltage at the output of master transconductance element 16. The difference between these values serves as an error input signal to master transconductance element 16 so that adjustments in transconductance may be continually made to ensure that transconductance current 36 tunes or locks to output reference current 34. Additionally, the output of error amplifier 14 serves as control signal 38.

Control signal 38 serves as an input to slave filter 12 along with cut-off frequency 26. Slave filter 12 may be any number of programmable, electronic filters such as a programmable, continuous-time electronic filter. Slave filter 12 receives slave filter input signal 44 for filtering. Slave filter 12 filters slave filter input signal 44 to produce filtered output signal 46 having a desired frequency-response characteristic at the desired cut-off frequency.

Various alternatives of the elements and operations of FIG. 1, as described above, are presented below. Slave filter 12 may be a programmable, electronic continuous-time filter such as a transconductance/capacitance filter or a MOSFET-capacitance filter. Programming of slave filters is often achieved by switching in or out capacitor or device elements. Control signal 38, provided as an output of error amplifier 14, may exist as a voltage or a current. Error amplifier 14 may be any number of well-known differential amplifier types known by one of ordinary skill in the art.

IDAC 20 could be configured to produce an output reference voltage as opposed to the output reference current described above. Additionally, circuitry may be provided in which initial cut-off frequency tuning signal 33 and specific cut-off frequency adjustment value 30 may be provided in analog format. ROM 22 and ROM decode 24 may be alternatively shown as any memory device. For example, ROM 22 and ROM decode 24 may be an electronic memory such as a read-only memory, a random-access-memory, an erasable programmable read-only memory, a programmable read-only memory, and an electrically erasable programmable read-only memory, a magnetic-bubble memory, or other electronic memory types.

FIG. 2 depicts a simplified schematic representation of an alternative embodiment of the programmable, electronic filter 10 having a cut-off frequency correction circuit. Programmable, electronic filter 10 includes slave filter 12, error amplifier 14, master transconductance element 16, capacitor 18, a second IDAC 46, IDAC 20, ROM 22, and ROM decode 24. The alternative embodiment of FIG. 2 provides similar signals as discussed above in FIG. 1. FIG. 2 includes second IDAC 42 which receives cut-off frequency signal 26 as an input and produces second output reference current 35 as an output in response thereto. IDAC 20 produces output reference current 34, as discussed above, as an output which is used as an input reference current to second IDAC 42. Second output reference current 35 then serves a similar purpose as output reference current 34 of FIG. 1.

IDAC 42 produces second output reference current 35 in response to receiving cut-off frequency signal 26 and output reference current 34. IDAC 42 generates second output reference current 35 in proportion to output reference current 34, serving as an input to IDAC 42. The relationship between second output reference current 35 and output reference current 34 depends upon the value of cut-off frequency signal 26. Once cut-off frequency signal 26 is established, second output reference current 35 remains proportional to output reference current 34 according to a constant value represented by beta. Second reference output current 35 then serves as a reference current for a tuning loop defined below.

Reference voltage 40, error amplifier 14, master transconductance element 16, transconductance current 36 and capacitor 18 cooperate to serve as the tuning loop. Specifically, second output reference current 35 is tuned or locked to transconductance current 36. Error amplifier 14 provides an output to master transconductance element 16 to ensure continual adjustment of transconductance current 36. The output of error amplifier 14 serves as control signal 38 to provide an input to slave filter 12.

Slave filter 12 does not receive cut-off frequency 26 as an input as shown in FIG. 1 but receives control signal 38 as an input. Slave filter 12 also receives slave filter input signal 44 to be filtered and provides filtered output signal 46 having the desired frequency-response characteristic at the desired cut-off frequency. The programmable, electronic filter 10, depicted in FIG. 2, accurately establishes the desired cut-off frequency.

In summary, the present invention ultimately provides a filtered output signal having a frequency response characteristic with a more accurate cut-off frequency and a programmable, electronic filter with the ability to achieve accurate cut-off frequencies within a small frequency range or within a small frequency increment. When an embodiment of the present invention uses read-only memory to store the cut-off frequency adjustment data, advantages are realized when the present invention is implemented in integrated circuit format. Read-only memory requires very little silicon area and hence provides decreased cost and packaging advantages. The present invention allows the specific cut-off frequency adjustment data to be modified through program control and provides for both positive and negative corrections to the cut-off frequency.

Thus, there has been provided, in accordance with the present invention, an apparatus and method for accurately establishing a cut-off frequency in an electronic filter that satisfy the advantages as set forth previously. Although the present invention and its advantages have been described in detail through the description of the above embodiments, it should be understood that various changes, substitutions and alterations can be made therein. For example, the functions of IDAC 20 and second IDAC 42 may be such that IDAC 20 receives cut-off frequency signal 26 and second IDAC 42 receives specific cut-off frequency adjustment value 30. Other examples are readily ascertainable to one skilled in the art and may be made without departing from the spirit and scope of the invention as defined by the appended claims.

What is claimed is:

1. A cut-off frequency correction circuit, for accurately establishing a cut-off frequency, comprising:
   a memory device to store cut-off frequency adjustment data corresponding to each of a plurality of cut-off frequencies, the memory device transmitting said cut-off frequency adjustment data in response to a desired one of the plurality of cut-off frequencies; and
   a cut-off frequency tuning circuit having a digital-to-analog converter, the digital-to-analog converter receiving the cut-off frequency adjustment data from the memory device, the digital-to-analog converter generating a reference current in response to the cut-off frequency adjustment data to correct deviations in said desired one of plurality of cut-off frequencies.

2. The cut-off frequency correction circuit of claim 1, wherein the memory device includes an electronic memory.

3. The cut-off frequency correction circuit of claim 2, wherein the memory device includes a read-only memory.

4. The cut-off frequency correction circuit of claim 2, wherein the memory device includes a random-access-memory.

5. The cut-off frequency correction circuit of claim 1, wherein the cut-off frequency adjustment data may increase or decrease the corresponding reference current.

6. The cut-off frequency correction circuit of claim 1, wherein the digital-to-analog converter also receiving an initial cut-off frequency tuning signal, and wherein the digital-to-analog converter provides a reference current in response to the initial cut-off frequency tuning signal and the cut-off frequency adjustment data.

7. The cut-off frequency correction circuit of claim 6, wherein the initial cut-off frequency tuning signal is established at a predefined one of the plurality of cut-off frequencies.

8. A programmable filter, for accurately establishing a cut-off frequency, comprising:
- a memory device to store cut-off frequency adjustment data corresponding to each of a plurality of cut-off frequencies, the memory device transmitting the cut-off frequency adjustment data in response to a desired one of the plurality of cut-off frequencies;
- a cut-off frequency tuning circuit having a digital-to-analog converter, the digital-to-analog converter receiving the cut-off frequency adjustment data from the memory device, the digital-to-analog converter generating a reference current in response to the cut-off frequency adjustment data, corresponding to the cut-off frequency adjustment data, and wherein the cut-off frequency tuning circuit produces a control signal in response to the reference current based on the cut-off frequency adjustment data to correct deviations in said one of the pluralities of cut-off frequencies; and
- a slave filter to receive the control signal, the slave filter establishing the cut-off frequency of the programmable filter to the desired one of the plurality of cut-off frequencies in response to the control signal.

9. The programmable filter of claim 8, wherein the memory device includes an electronic memory.

10. The programmable filter of claim 8, wherein the digital-to-analog converter also receives an initial cut-off frequency tuning signal to be held constant for all of the plurality of cut-off frequencies, the digital-to-analog converter generating the reference current in response to the initial cut-off frequency tuning signal and the cut-off frequency adjustment data.

11. The programmable filter of claim 10, wherein the initial cut-off frequency tuning signal is established at a predefined one of the plurality of cut-off frequencies.

12. The programmable filter of claim 11, wherein the cut-off frequency adjustment data corrects for variations introduced by the initial cut-off frequency tuning signal for cut-off frequencies other than the predefined one of the plurality of cut-off frequencies.

13. The programmable filter of claim 8, wherein the cut-off frequency tuning circuit includes a tuning loop for producing the control signal as an output in response to receiving the reference current from the digital-to-analog converter.

14. The programmable filter of claim 8, wherein the slave filter includes a transconductance/capacitance type filter.

15. A method for producing a corresponding reference current for use in accurately establishing a cut-off frequency in a programmable filter, comprising the steps of:
- receiving an initial cut-off frequency tuning signal, the initial cut-off frequency tuning signal being established at a predefined one of a plurality of cut-off frequencies;
- receiving cut-off frequency adjustment data corresponding to a desired one of the plurality of cut-off frequencies;
- adjusting the desired one of the plurality of cut-off frequencies by the cut-off frequency adjustment data and
- generating a reference current corresponding to the desired one of the plurality of cut-off frequencies in response to the initial cut-off frequency tuning signal and the cut-off frequency adjustment data.

16. The method of claim 15, wherein the method further comprises the step of correcting the cut-off frequency adjustment data for variations introduced by the initial cut-off frequency tuning signal for the desired one of the plurality of cut-off frequencies.

17. The method of claim 15 further comprising the step of receiving the desired one of the plurality of cut-off frequencies and locating the corresponding cut-off frequency adjustment data as stored in electronic memory.

18. The method of claim 15 further comprising the step of establishing the initial cut-off frequency tuning signal to compensate for variances in a capacitance of a slave filter at the predefined one of the plurality of cut-off frequencies.

19. The method of claim 15, wherein the reference current generating step includes the step of modifying an input current in response to the initial cut-off frequency tuning signal and the cut-off frequency adjustment data.

20. The method of claim 15 further comprising the step of generating a control signal, for use as an input to a slave filter, in response to the reference current.

* * * * *